United States Patent [19]
Dhong et al.

[11] Patent Number: 6,014,763
[45] Date of Patent: *Jan. 11, 2000

[54] AT-SPEED SCAN TESTING

[75] Inventors: Sang Hoo Dhong; Harm Peter Hofstee, both of Austin; Kevin John Nowka, Round Rock, all of Tex.; Joel Abraham Silberman, Somers, N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/007,670

[22] Filed: Jan. 15, 1998

[51] Int. Cl.$^7$ .................................................. G01R 31/28
[52] U.S. Cl. ................................................................ 714/724
[58] Field of Search .................................... 714/724, 726, 714/727, 728, 729, 731, 733, 734, 742, 744; 365/201; 326/73.1

[56] References Cited

U.S. PATENT DOCUMENTS

| | | | |
|---|---|---|---|
| 5,235,600 | 8/1993 | Edwards | 714/726 |
| 5,355,369 | 10/1994 | Greenbergerl et al. | 371/22.3 |
| 5,381,420 | 1/1995 | Henry | 371/22.3 |
| 5,386,392 | 1/1995 | Cantiant et al. | 365/233 |
| 5,504,756 | 4/1996 | Kim et al. | 371/22.3 |
| 5,519,715 | 5/1996 | Hao et al. | 371/22.3 |
| 5,524,114 | 6/1996 | Peng | 714/724 |
| 5,592,496 | 1/1997 | Shimizu et al. | 714/724 |
| 5,614,838 | 3/1997 | Jaber et al. | 324/765 |
| 5,717,702 | 2/1998 | Stokes et al. | 714/730 |
| 5,912,901 | 6/1999 | Adams et al. | 714/733 |

OTHER PUBLICATIONS

IBM Technical Disclosure Bulletin, "LSSD Clock Generation Using Fundamental Mode Circuits," vol. 29, No. 1, Jun. 1986.

IBM Technical Disclosure Bulletin, "Mechanism for Scan-Based Test Application at High-Speed," vol. 39, No. 09, Sep. 1996.

*Primary Examiner*—Hoa T. Nguyen
*Attorney, Agent, or Firm*—Casimer K. Salys; Jack V. Musgrove; Andrew J. Dillon

[57] ABSTRACT

A method of scanning an integrated circuit, by converting a parallel scan input (scan data and scan control) to serial, passing the serial scan input through scan circuitry to create a serial scan output, converting the scan output from serial to parallel, transmitting the scan output in parallel from the integrated circuit to the tester. A tester clock signal is derived by synchronizing the tester to a divided clock signal (1/N) of the integrated circuit. Communications take place at a speed of the tester clock signal, but the scan operates at the full operational speed of the device under test. At-speed scan testing can be achieved for speeds in excess of 1 GHz.

27 Claims, 6 Drawing Sheets

AT-SPEED SCAN TESTING

BACKGROUND OF THE INVENTION

1. Field of the Invention The present invention generally relates to integrated circuits, particularly those used with computer systems, and more particularly to an improved method of scanning high speed integrated circuits (including microprocessors) to test logic circuits and interconnections.

2. Description of Related Art

Integrated circuits are used in a wide variety of products, and many of these circuits, such as microprocessors, adapter chips, etc., have complicated logic designs. These designs are often buried in the microchip layers, and can be difficult to test. A generalized integrated circuit is shown in FIG. 1. Circuit 10 includes several logic function circuits 12, 14, 16 and 18, and several flip-flops, or latches, 20, 22, 24, 26 and 28. The logic functions have various inputs, and their outputs are connected to various latches, for example, logic function 12 has four outputs respectively connected to latches 20–26. Each logic function has many logic components (gates, inverters, etc.) arranged to provide a particular function, such as a register or execution unit. The latches store data, and may provide inputs to other logic functions, such as latches 20 and 24 which are connected to logic function 16. Circuit 10 may have one or more latches such as 28 which provides the output of the circuit. A clock signal 30 provides synchronization (control) for the latches. The clock may be a primary input to the circuit or internally generated.

Those skilled in the art will appreciate that, in the example of FIG. 1, the circuit is greatly simplified since there are many more logic functions and latches in a typical integrated circuit, and the logic functions can be very complicated; additionally, more than one clock signal can be provided. This figure is still adequate, however, for understanding how testing of the integrated circuit (or portions thereof) can be performed. One method involves the use of test patterns which are fed into the primary inputs of the integrated circuit while the output is examined. This approach is limited by the structure of the logic design and may fail to detect unusual flaws or defects in a particular design.

Another testing approach is to provide a mechanism for setting the latches to predefined states using special lines which are provided on the microchip, such as scan line 32 which is connected directly to latch 20, and scan line 34 which directly interconnects latch 20 with latch 28 (other scan lines, not shown, can be provided for the other latches, depending upon the type of scan implementation). Separate control is provided for scanning the latches, using a test clock 36. A scan output line 38 may also be provided. The relationship between the scan circuitry (tester) and the integrated circuit is thus master-slave, i.e., the tester is the master and controls the integrated circuit (the device under test, or DUT). As noted in the foregoing paragraph, while the scan design depicted in FIG. 1 is fairly simple, conventional scan designs can have greatly increased complexity according to the sophistication of the logic circuits and the desired testing capabilities. Scan functions typically provide a lower grade implementation than the full functionality afforded by the DUT.

Some testers (e.g., the multiplexed D flip-flop scan design) suffer from the disadvantage of not being able to scan the DUT at its intended operational speed (the "at-speed" defined by the integrated circuit's system clock). With reference to the example of FIG. 1, the clock speed of the system clock signal 30 would thus be significantly higher than the speed (frequency) of the tester clock signal 36. This limitation is generally applicable to high speed integrated circuits, that is, those running a system clock at greater than 100 MHz, and the effects are even more pronounced at speeds greater than 500 MHz, and still worse at state-of-the-art speeds of 1 GHz or more. The slower scan speed is required as a result of various physical constraints that arise between the tester and the chip, that are different from corresponding constraints that exist within the chip. Clock synchronization is difficult, and the slightest discontinuities in the wires between the tester and the chip can lead to considerable signal degradation. If a scan is run at a very high clock speed, logic errors may occur that do not accurately reflect the normal operation (non-scan mode) of the DUT.

A variation of this test technique, IBM's Level Sensitive Scan Design (LSSD) testing, can be adapted to provide at-speed testing of integrated circuits, by using a frequency multiplying device. See U.S. Pat. No. 5,614,838. At-speed testing is achieved even though the tester is not capable of generating the necessary signals at the frequency required by the DUT. This approach, however, has several disadvantages. The first disadvantage is the added complexity that is required for LSSD (as compared to a generalized scan design, or GSD, which does not use level sensitivity). Also, since the internal clock is derived from the tester clock by frequency multiplication, the design requires narrow tolerances on this tester clock and control signals so that the DUT can synchronize successfully. These tolerances are difficult to achieve for very high speed testing.

Other techniques can be used to provide at-speed testing, but they suffer other limitations. For example, at-speed testing can be achieved by decoupling the scan path interface, as taught by U.S. Pat. No. 5,381,420. The internal scan paths are driven by the system clock of the DUT, but the test logic is driven by the test clock. That design also uses a serial-to-parallel converter on the data input. As a consequence, even though the tester can perform a given scan of the DUT at full speed, new scan data is not provided at every cycle of the DUT. In U.S. Pat. No. 5,355,369, the DUT is required to have a digital processor that is functional enough to load from and store to a digital test register. This restriction is not too severe if the test is used to screen parts of a chip whose design is known to be functional, but it becomes impractical for testing of a new design. Another approach, discussed in U.S. Pat. No. 5,519,715, achieves at-speed testing operation by disabling the processor while slowly loading caches with test programs and data. This method cannot, however, operate a scan chain at high frequency, and does not allow high speed scan test (AC test) of single functional blocks within the processor.

In light of the foregoing, it would be desirable to devise a method of scanning an integrated circuit which allowed for at-speed testing, but did not impose excessive overhead on the latches by the scan chain. It would be further advantageous if the method could address additional problems that arise with scan paths, such as dealing with heavily loaded signals which must be amplified to desired levels and distributed over the chip, often via long wires in the scan path. Finally, to ensure that the scan test closely resembles actual high-speed operation, it is desirable to not change clock frequencies between scan and functional mode.

SUMMARY OF THE INVENTION

It is therefore one object of the present invention to provide an improved scan technique for testing integrated circuits.

It is another object of the present invention to provide such a method that is particularly adapted for at-speed testing of high speed integrated circuits.

It is yet another object of the present invention to provide such a method that reduces the complexity of the latches imposed by the scan chain.

The foregoing objects are achieved in a method of scanning data storage elements (e.g., latches or flip-flops) in an integrated circuit, generally comprising the steps of transmitting a scan input in parallel from a tester to the integrated circuit, converting the scan input at the integrated circuit from parallel to serial, and passing the serial scan input through scan circuitry of the integrated circuit, to create a serial scan output. The transmitting step includes the steps of transmitting a scan data input in parallel, and transmitting a scan enable input in parallel. If loading the caches through the scan chain is desired, the control signal (cache enable) is also transmitted in parallel. The scan output can further be converted from serial to parallel, and the scan output transmitted in parallel from the integrated circuit to the tester. A tester clock signal is derived by synchronizing the tester to a divided clock signal (1/N) of the integrated circuit, whereby the tester acts as a clock slave and the integrated circuit acts as a clock master. The transmitting step takes place at a speed of the tester clock signal, but the scan operates at the full operational speed of the device under test. The invention can optionally allow for an external scan input which can be used to run the scan at a lower speed. A bypass mechanism can also be used to skip the actual scan in order to check the scan interface. The scan enable input can be distributed to the scan circuitry using a plurality of multiplexers configured in a tree structure. At-speed scan testing can be achieved for speeds in excess of 1 GHz.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DESCRIPTION OF AN ILLUSTRATIVE EMBODIMENT

Figure 1:
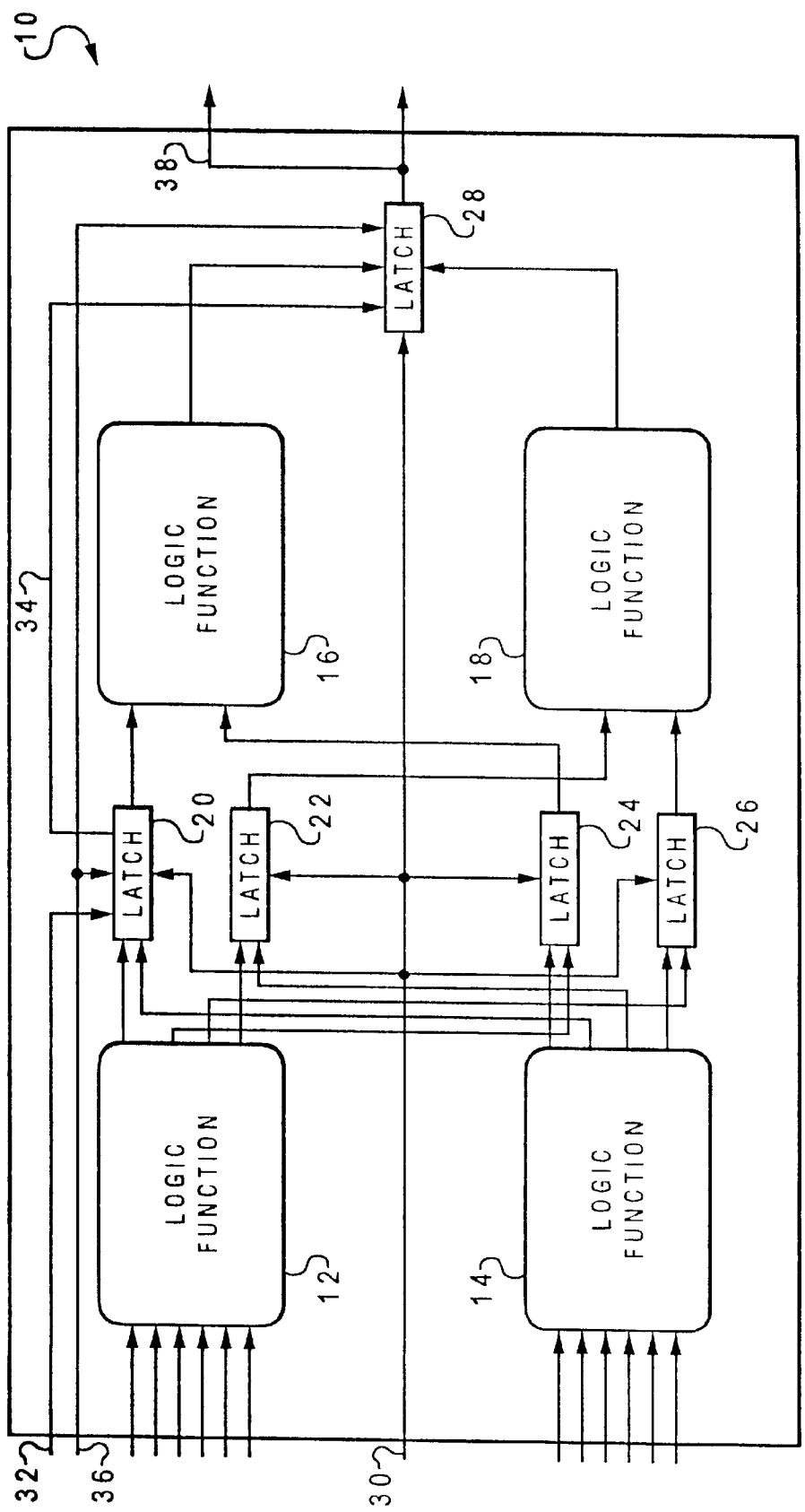
FIG. 1 is a simplified block diagram of a conventional integrated circuit having scan circuitry.
Figure 2:
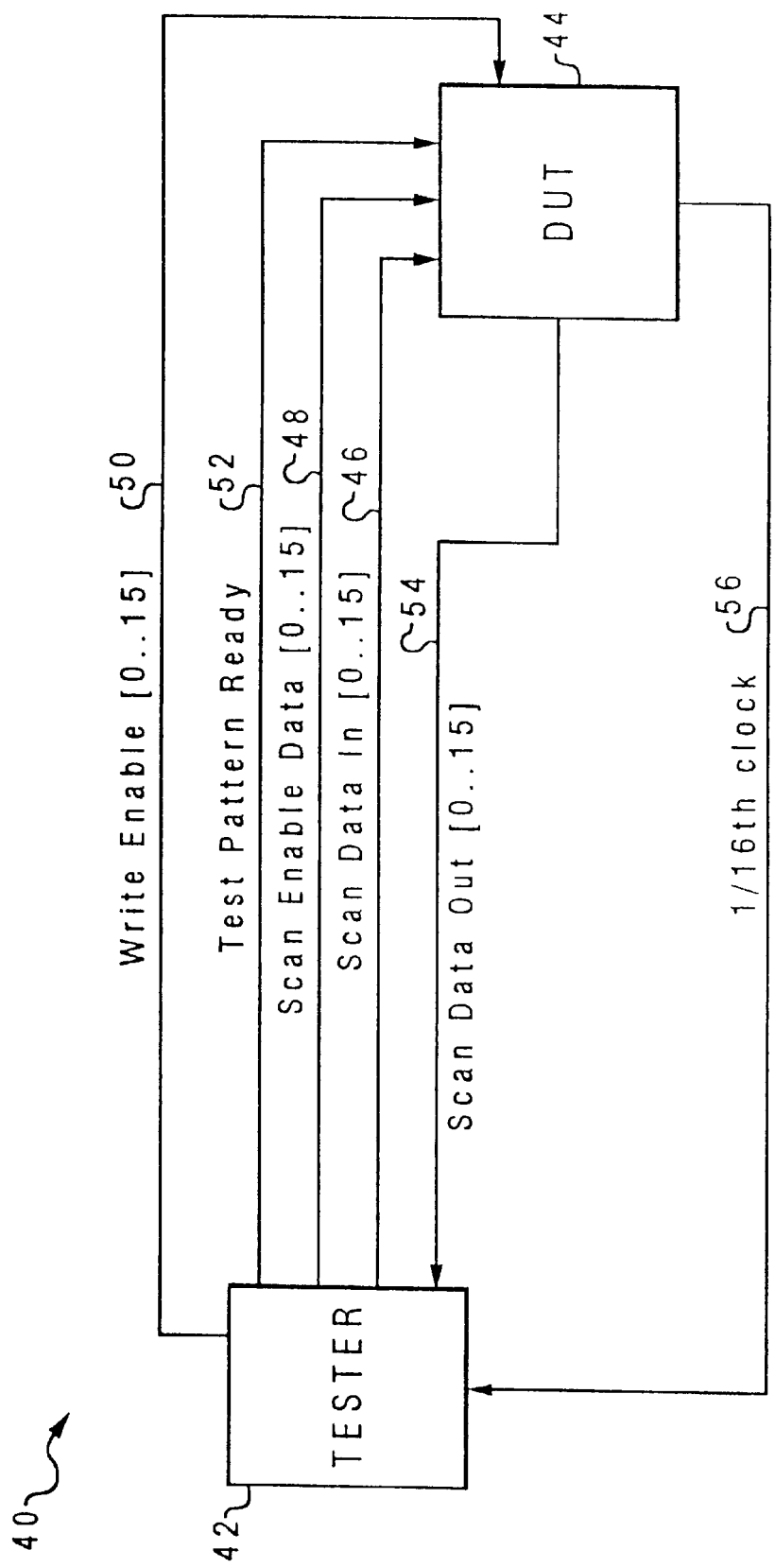
FIG. 2 is a block diagram depicting one embodiment of an integrated circuit testing system constructed in accordance with the present invention.

With reference now to the figures, and in particular with reference to FIG. 2, there is depicted one embodiment 40 of an at-speed scanning system according to the present invention, which allows testing of logic functions and data storage elements (latches or flip-flops) in an integrated circuit including, without limitation, a computer microprocessor or an adapter chip for a computer peripheral. The novel scan systems disclosed herein may be implemented with any type of integrated circuit (IC), including circuits which are otherwise conventional, but it could also be used in circuits having additional novel elements. Therefore, application of the invention should not be considered as limited to any particular IC logic design.

The design of system 40 includes a tester 42, an integrated circuit or device under test (DUT) 44, and several lines or wires which interconnect tester 42 with DUT 44, namely, a scan data bus 46 ("Scan Data In"), a scan enable bus 48 ("Scan Enable Data"), a cache scan-write enable bus 50 ("Write Enable"), a control line 52 ("Test Pattern Ready"), and a scan output bus 54 ("Scan Data Out"). As discussed further below, in this implementation each of the buses 46, 48, 50 and 54 has 16 lines ([0 . . . 15]), and a clock signal 56 is provided having a frequency which is one-sixteenth that of the system clock.

The present invention makes it possible to scan-test a high-frequency integrated circuit at the speed it was designed to run during normal operation (non-scan mode). As explained below in conjunction with FIG. 3, each of the input signals that are required on a DUT cycle-by-cycle basis (scan data, scan enable and cache scan-write enable) are transmitted in a parallel fashion with N number of signals being provided in a given cycle, where N is an integer greater than 1. The signals then undergo parallel-to-serial conversion inside DUT 44. Similarly, scan-out data is fed through a serial-to-parallel converter inside DUT 44. All communication between tester 42 and DUT 44 accordingly occurs at a speed of 1/N of the internal DUT clock frequency. Hence, one test cycle is equal to N times the DUT cycle. In the depicted embodiment, N is equal to 16, but other values can be used.

DUT 44 internally divides the clock by N and provides this 1/N clock to tester 42, which synchronizes to this divided clock. Tester 42 does not observe the high-frequency clock signal that is fed directly to DUT 44. In essence, therefore, DUT 44 is the clock master and tester 42 the clock slave, since the system clock of DUT 44 regulates the testing logic. Since the scan clock is not derived from the tester clock, the present invention does not require a synchronizer in the device under test (instead, the synchronizer is in the tester and synchronizes to the divided frequency). Also, the scan chain shares its clock with the rest of the DUT. There is no separate clock going to the latches of DUT 44 to support the scan mode.

Control line 52 is optionally provided, to allow the tester to control initiation of scan testing. In other words, the parallel/serial interface on chip 44 is enabled by the "Test Pattern Ready". Thus, while tester 42 operates as a clock slave to DUT 44 since it has to use the DUT clock, tester 42 still controls the start of the scan test.

Figure 3:
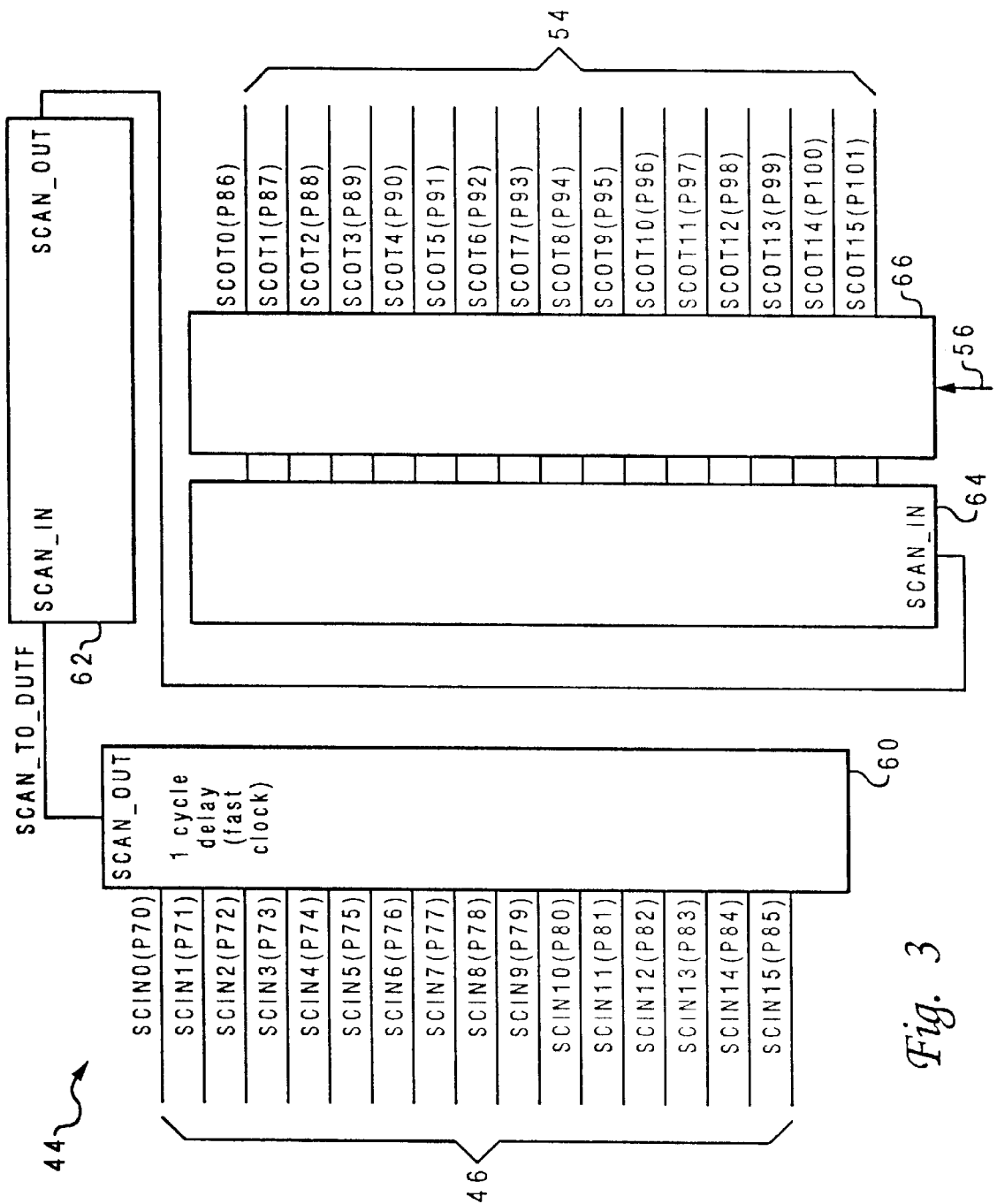
FIG. 3 is a high-level schematic diagram depicting the scan data portion of the integrated circuit testing system of FIG. 2.

Referring now to FIG. 3, DUT 44 includes a parallel-to-serial converter 60 which receives the 16 scan data inputs 46 from tester 42, and provides a single output to the scan circuitry 62. New scan data can be provided every DUT cycle (successive cycles) during the scan. The output of the scan is fed to a serial-to-parallel converter 64 which is used to load a latch 66. The 16 scan data outputs 54 of latch 66 are returned to tester 44. Similar parallel-to-serial converters may be provided for the scan enable inputs 48 and cache enable inputs 50 (see FIG. 4).

Tester 42 may conveniently take the form of a conventional tester which has been modified or adapted to provide and receive the scan signals in parallel. A suitable test device can be constructed for use with the present invention utilizing a Hewlett-Packard HP82000 tester.

Figure 4:
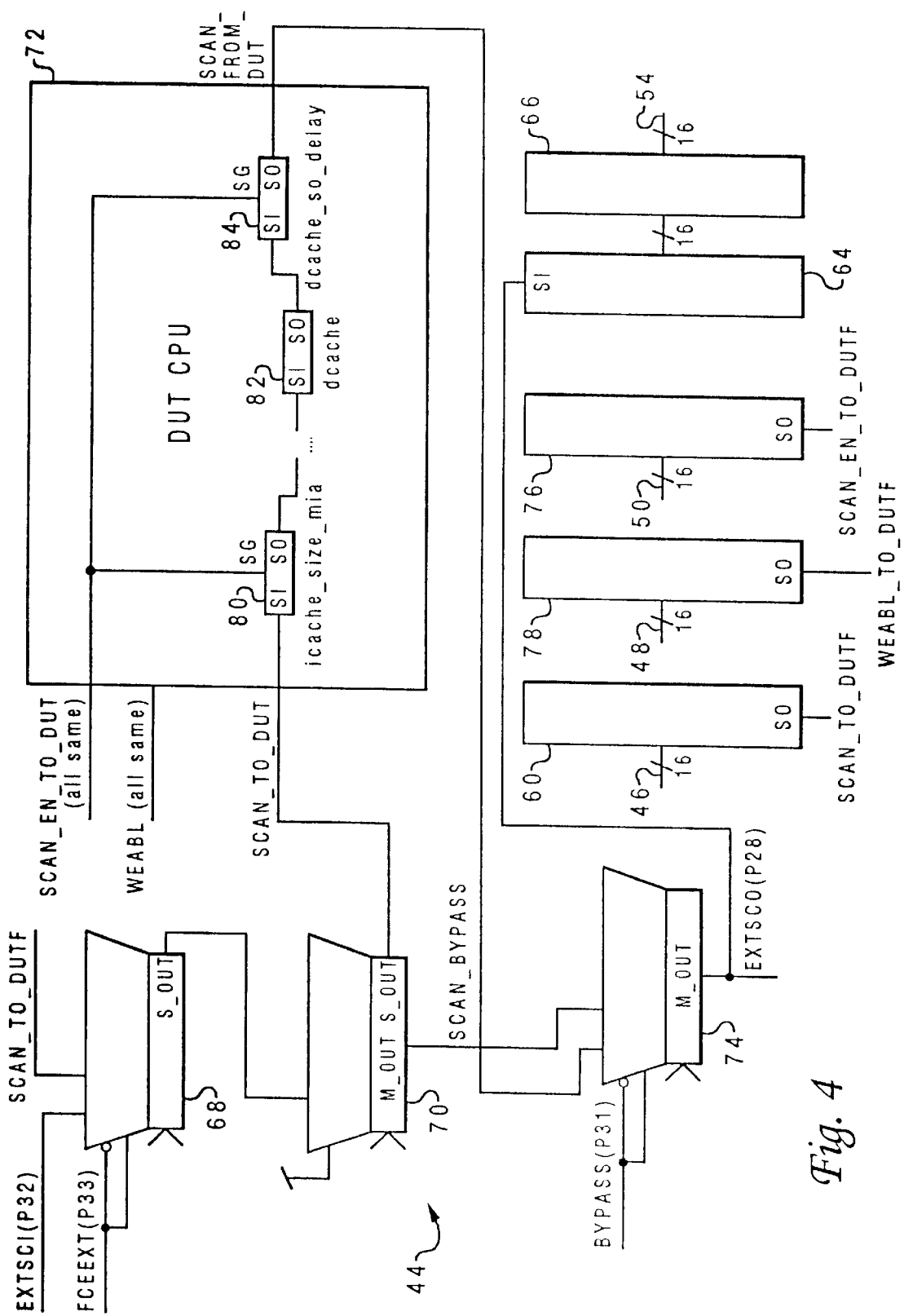
FIG. 4 is a high-level schematic diagram depicting additional components of the integrated circuit testing system of FIG. 2.

With further reference to FIG. 4, additional details of DUT 44 and scan circuitry 62 are disclosed. The output of parallel-to-serial converter 60 ("SCAN_TO_DUTF") is connected to an input of a multiplexer/latch 68 which is controlled by a force external scan line ("FCEEXT"). This line is used to provide conventional (serial) scan inputs when the scan is to be run at the lower reference speed (using a scan clock, not the system's normal operating speed). The serial external scan chain is provided at the second input to multiplexer/latch 68 ("EXTSCI").

The output of multiplexer/latch 68 is duplicated using another multiplexer/latch 70. The duplication allows the unaltered scan chain to bypass the remainder of the scan circuitry (the core or central processing unit 72) in order to test the scan interface. The bypass mechanism includes another multiplexer/latch 74 which receives one of the outputs of multiplexer/latch 70, and is controlled by a bypass signal ("BYPASS"). When the BYPASS line is active, multiplexer/latch 74 overrides the actual scan by selecting the output of multiplexer/latch 70.

If the bypass mechanism is not used, the scan proceeds with the scan chain being fed to core 72, along with the scan control signals from the scan enable parallel-to-serial converter 76, while cache scan-load is controlled from the output of the cache enable parallel-to-serial converter 78. The scan chain passes through the logic circuits in core 72, beginning with a first latch 80 and ending with a last latch 82. Another latch 84 is used as a buffer to allow the scan chain to maintain high speed. The scan output is fed to the second input of multiplexer/latch 74. The output of multiplexer/latch 74 ("EXTSCO") is provided to buffer 64. The output of multiplexer/latch 74 can be examined directly if serial-to-parallel conversion is unnecessary (i.e., when using the external scan chain forced by the FCEEXT line).

Figure 6:
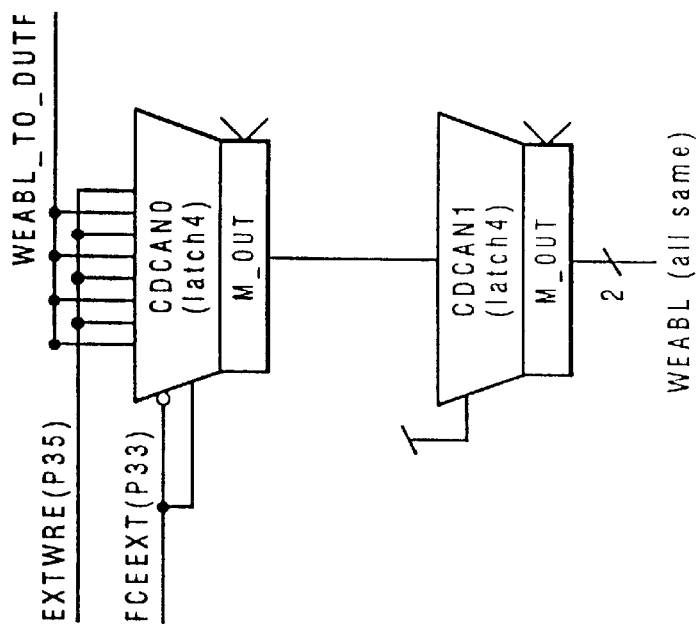
FIG. 6 is a high-level schematic diagram depicting another portion of a scan interface which can be used with the integrated circuit testing system of FIG. 2 in accordance with the present invention.
Figure 5:
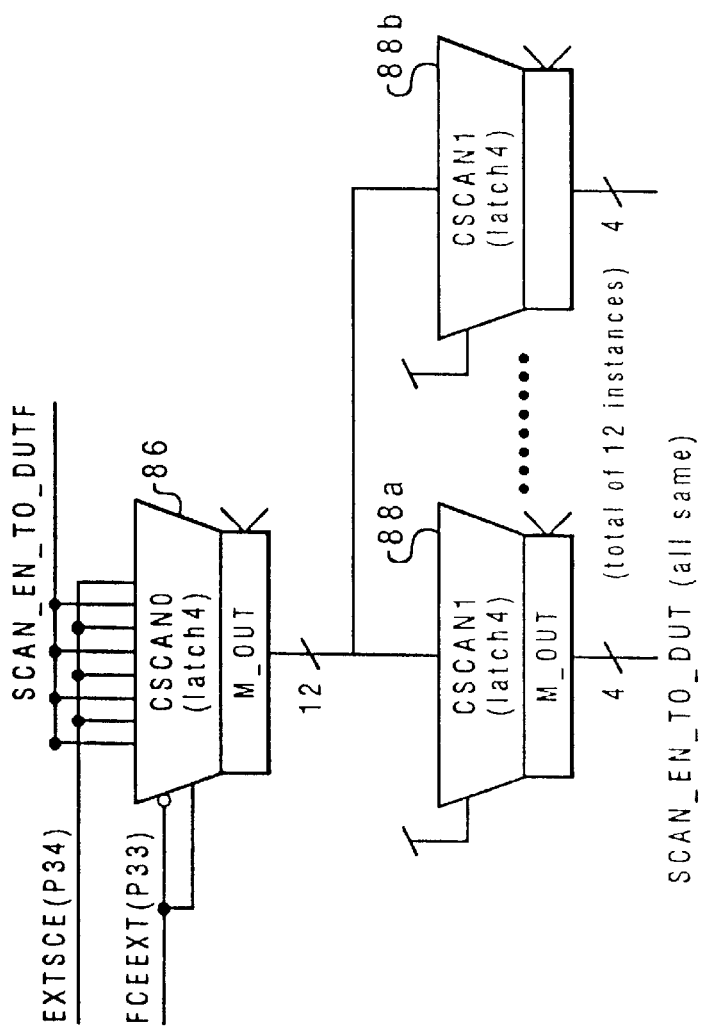
FIG. 5 is a high-level schematic diagram depicting a portion of a scan interface which can be used with the integrated circuit testing system of FIG. 2 in accordance with the present invention.

As further illustrated in FIG. 5, the scan chain is preferably implemented using additional multiplexer input ports to reduce the load on each distributed signal. The scan enable line is fed to multiple inputs of another multiplexer/latch 86 which splits the signal into 12 different lines that are fed to second-level multiplexer/latches, two of which 88*a* and 88*b* are shown. The outputs of each of the second-level multiplexer/latches can be similarly split to provide another four inputs to four third-level multiplexer/latches (not shown). In this manner, 48 identical scan enable outputs can be provided. This tree structure for distributing the scan chain can allow the scan speed to actually exceed the processor's normal operational speed. In a similar manner, another multiplexer/latch 90 can be used as illustrated in FIG. 6, to divide the cache enable signal into two identical signals, one for the instruction cache, and one for the data cache.

Figure 7:
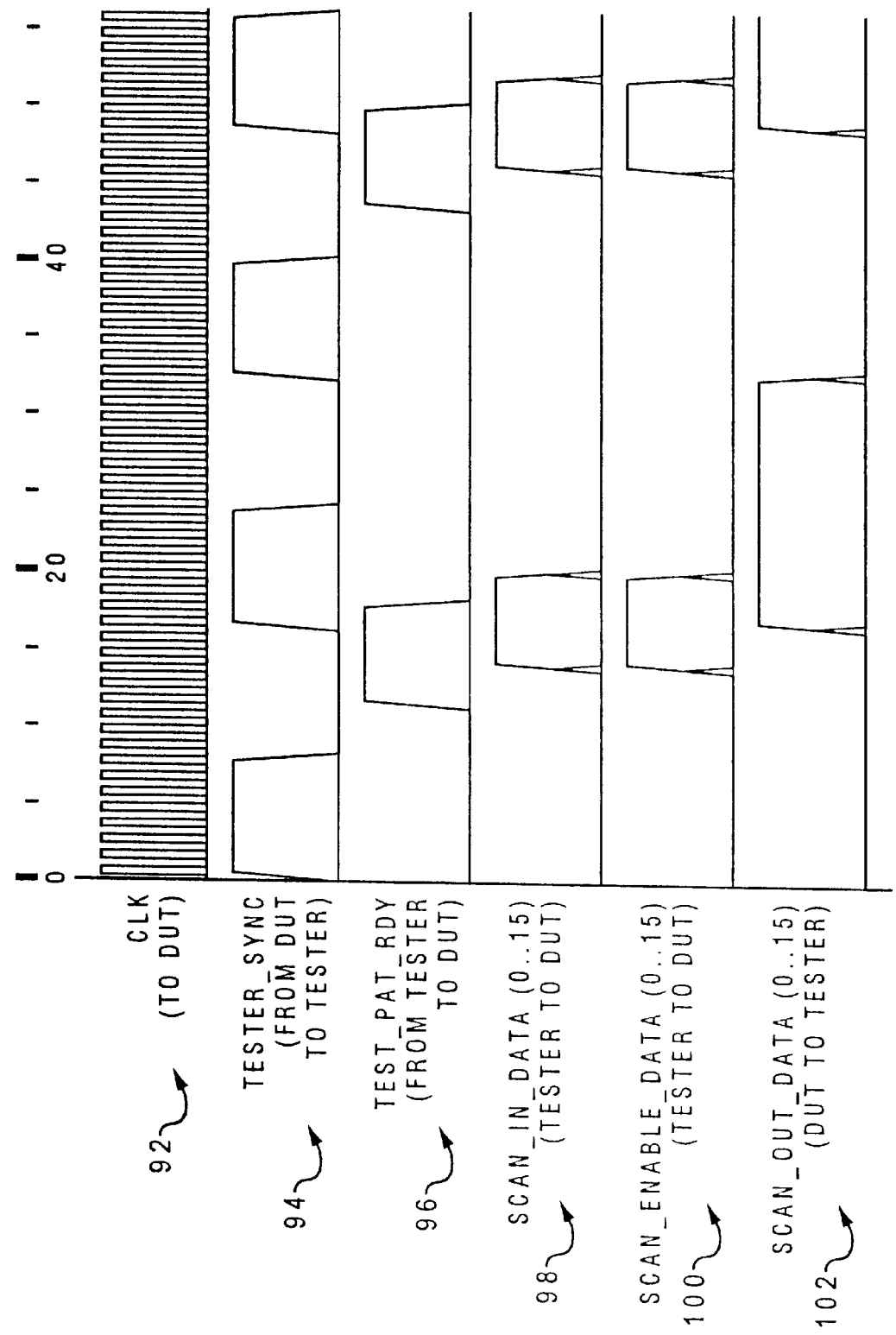
FIG. 7 is a timing diagram illustrating a system clock signal and related control signals used with the integrated circuit testing system of FIG. 2.

The invention can be further understood with reference to the timing diagram of FIG. 7. The DUT system clock signal 92 is shown at the top. The next signal is the tester clock signal 94, i.e., derived from 1/N of the DUT clock signal. The next line down reveals the Test Pattern Ready signal 96, which is synchronized by the tester clock signal 94, and which in turn prompts the scan data signals 98. The timing of the scan enable signals 100 is identical to that of the scan data signal 98, as is the cache enable signal (not shown). The bottom of the diagram shows the scan output signal 102 which is stable for N-1 of the N DUT clock cycles.

The foregoing construction has several advantages. Heavily loaded signals (e.g., scan enable) are delayed (and latched) after the parallel-to-serial conversion by a number of cycles that suffices to amplify them to the desired levels and distribute them over the chip. There are no long wires in the scan path, and the scan path is designed to run at the same frequency as the rest of the DUT. Long wires in the scan path can be split by placing additional latches. As a consequence, the DUT can switch between scan mode and functional mode on a DUT cycle-by-cycle basis. No "hold" state is required between the scan and normal operation. These advantages hold true for frequencies well above 100 MHz, and beyond 1 GHz.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

We claim:

1. A method of scanning an integrated circuit, comprising the steps of:
   transmitting a scan input in parallel from a tester to the integrated circuit;
   converting the scan input at the integrated circuit from parallel to serial; and
   passing the serialized scan input through scan circuitry of the integrated circuit, to create a serial scan output.

2. The method of claim 1 wherein said transmitting step includes the steps of:
   transmitting a scan data input in parallel; and
   transmitting a scan enable input in parallel.

3. The method of claim 1 further comprising the step of deriving a tester clock signal by synchronizing the tester to a divided clock signal of the integrated circuit, whereby the tester acts as a clock slave and the integrated circuit acts as a clock master, and said transmitting step takes place at a speed of the tester clock signal.

4. The method of claim 1 wherein said passing step includes the steps of:
   providing the serialized scan input to a multiplexer which also receives an external scan input; and
   selecting the serialized scan input for an output of the multiplexer.

5. The method of claim 1 wherein:
   the integrated circuit has a normal operation frequency with associated cycles; and
   said passing step includes the step of providing new scan data during each of a plurality of successive cycles of the integrated circuit.

6. The method of claim 1 further comprising the steps of:
   converting the scan output from serial to parallel; and
   transmitting the scan output in parallel from the integrated circuit to the tester.

7. The method of claim 1 further comprising the step of providing the serialized scan input to a path which bypasses the scan circuitry.

8. The method of claim 1 wherein said passing step includes the step of distributing a scan enable input to a plurality of data storage elements in the scan circuitry using a plurality of latches configured in a tree structure.

9. The method of claim 1 further comprising the steps of:
transmitting a cache write enable input in parallel from the tester to the integrated circuit; and
converting the cache write enable input at the integrated circuit from parallel to serial.

10. The method of claim 4 wherein:
the external scan input is designed for a scan speed which is lower than a normal speed of the integrated circuit; but
said passing step occurs at the normal speed of the integrated circuit.

11. The method of claim 5 wherein said passing step loads the serialized scan input in the scan circuitry at a frequency of at least 1 GHz.

12. An integrated circuit comprising:
a plurality of data storage elements having inputs and outputs;
a plurality of logic functions having inputs, and outputs connected to respective inputs of said data storage elements;
a scan path; and
means for scanning said data storage elements using said scan path at a normal operating speed of the integrated circuit.

13. The integrated circuit of claim 12 wherein said scanning means includes means for converting a parallel scan input to a serialized scan input.

14. The integrated circuit of claim 12 further comprising means for providing a divided clock signal to a tester.

15. The integrated circuit of claim 12 wherein said scanning means includes means for selecting between a serialized scan input and an external scan input.

16. The integrated circuit of claim 12 wherein said scanning means provides new scan data during each of a plurality of successive cycles of the integrated circuit.

17. The integrated circuit of claim 12 wherein said scanning means creates a serial scan output, and further comprising means for converting said serial scan output to parallel.

18. The integrated circuit of claim 12 further comprising means for bypassing said scanning means to provide a serial scan input at a scan output.

19. The integrated circuit of claim 12 further comprising means for distributing a scan enable input to said data storage elements.

20. The integrated circuit of claim 12, further comprising means for converting a cache write enable input from parallel to serial.

21. The integrated circuit of claim 13 wherein said converting means includes:
means for converting a parallel scan data input to a serial scan data input; and
means for converting a parallel scan enable input to a serial scan enable input.

22. A scan system comprising:
an integrated circuit;
a tester; and
means connecting said integrated circuit to said tester such that said tester can perform a scan of said integrated circuit at an effective speed which is equal to a normal operating speed of said integrated circuit.

23. The scan system of claim 22 wherein said connecting means includes means for converting a parallel scan input from said tester to a serial scan input.

24. The scan system of claim 22 wherein said connecting means includes means for converting a serial scan output from said integrated circuit to a parallel scan output.

25. The scan system of claim 22 wherein said connecting means provides N parallel scan inputs, where N is an integer greater than 1, and derives a tester clock signal having a frequency which is 1/N of a frequency of a system clock signal of said integrated circuit.

26. The scan system of claim 22 wherein said connecting means includes means for selecting between a serial scan input and an external scan input.

27. The scan system of claim 22 wherein said connecting means includes means for bypassing said scan of said integrated circuit.

* * * * *